(12) United States Patent
Feil

(10) Patent No.: US 12,389,658 B2
(45) Date of Patent: Aug. 12, 2025

(54) SEMICONDUCTOR DIE WITH A TRANSISTOR DEVICE AND METHOD OF MANUFACTURING THE SAME

(71) Applicant: Infineon Technologies Austria AG, Villach (AT)

(72) Inventor: Thomas Feil, Villach (AT)

(73) Assignee: Infineon Technologies Austria AG, Villach (AT)

( * ) Notice: Subject to any disclaimer, the term of this patent is extended or adjusted under 35 U.S.C. 154(b) by 427 days.

(21) Appl. No.: 17/743,523

(22) Filed: May 13, 2022

(65) Prior Publication Data
US 2022/0376063 A1 Nov. 24, 2022

(30) Foreign Application Priority Data
May 21, 2021 (EP) ..................................... 21175154

(51) Int. Cl.
| | |
|---|---|
| *H10D 64/00* | (2025.01) |
| *H01L 21/765* | (2006.01) |
| *H10D 30/01* | (2025.01) |
| *H10D 62/17* | (2025.01) |
| *H10D 84/00* | (2025.01) |

(52) U.S. Cl.
CPC ......... *H10D 64/117* (2025.01); *H01L 21/765* (2013.01); *H10D 30/0291* (2025.01); *H10D 62/393* (2025.01); *H10D 84/146* (2025.01)

(58) Field of Classification Search
CPC . H01L 29/407; H01L 21/765; H01L 29/1095; H01L 29/66712; H01L 29/7806; H01L 29/0878; H01L 29/41766; H01L 29/7802; H10D 64/117; H10D 30/0291; H10D 62/393; H10D 84/146; H10D 30/66; H10D 62/157; H10D 64/256

See application file for complete search history.

(56) References Cited

U.S. PATENT DOCUMENTS

| | | | |
|---|---|---|---|
| 6,362,505 B1 | 3/2002 | Tihanyi | |
| 10,243,071 B2 * | 3/2019 | Zundel | ............. H01L 29/66734 |
| 2002/0175351 A1 | 11/2002 | Baliga | |
| 2004/0007766 A1 | 1/2004 | Nakayama et al. | |
| 2018/0226502 A1 | 8/2018 | Kawahara et al. | |

FOREIGN PATENT DOCUMENTS

JP 2000208757 A 7/2000

* cited by examiner

*Primary Examiner* — Steven B Gauthier
*Assistant Examiner* — Khatib A Rahman
(74) *Attorney, Agent, or Firm* — Murphy, Bilak & Homiller, PLLC

(57) ABSTRACT

The disclosure relates to a semiconductor die with a transistor device, having a source region, a drain region, a body region including a channel region, a gate region, which includes a gate electrode, next to the channel region, for controlling a channel formation, a drift region between the channel region and the drain region, and a field electrode region with a field electrode formed in a field electrode trench, which extends into the drift region, wherein the channel region extends laterally and is aligned vertically with the gate region, and wherein at least a portion of the channel region is arranged vertically above the field electrode region.

16 Claims, 8 Drawing Sheets

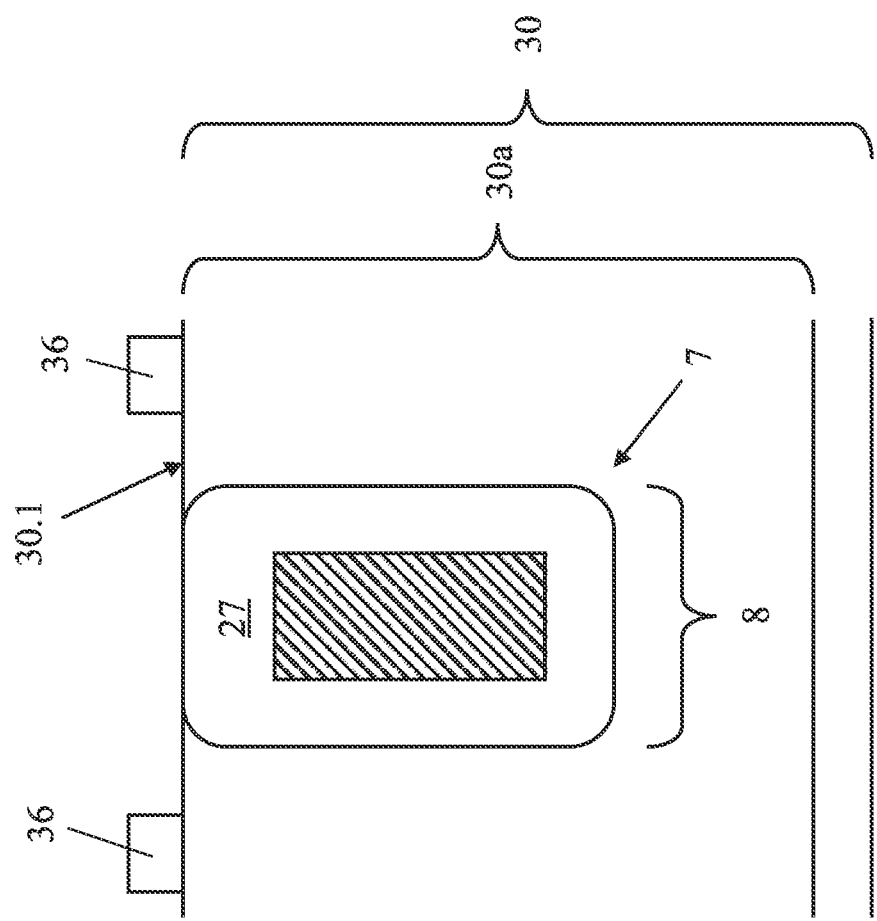
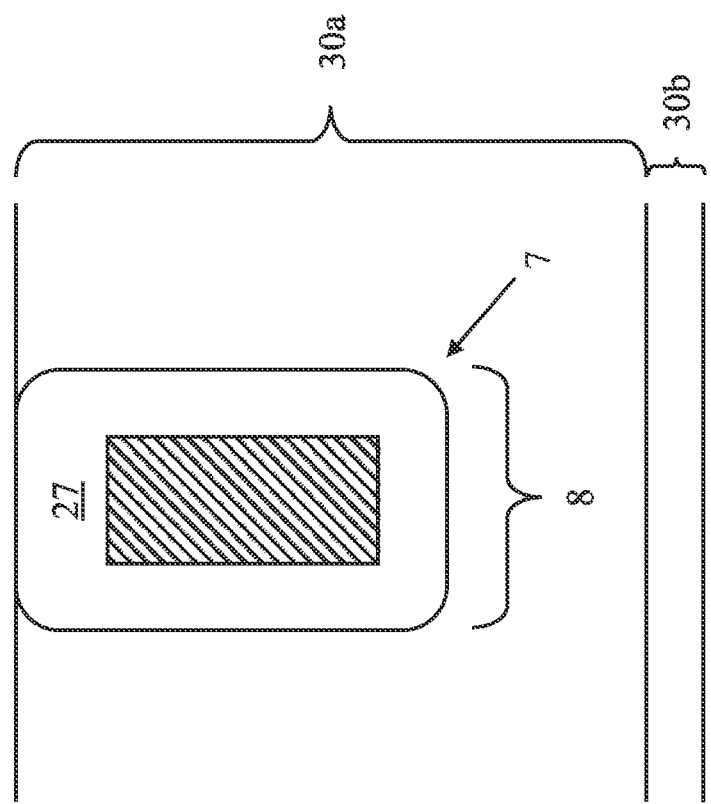

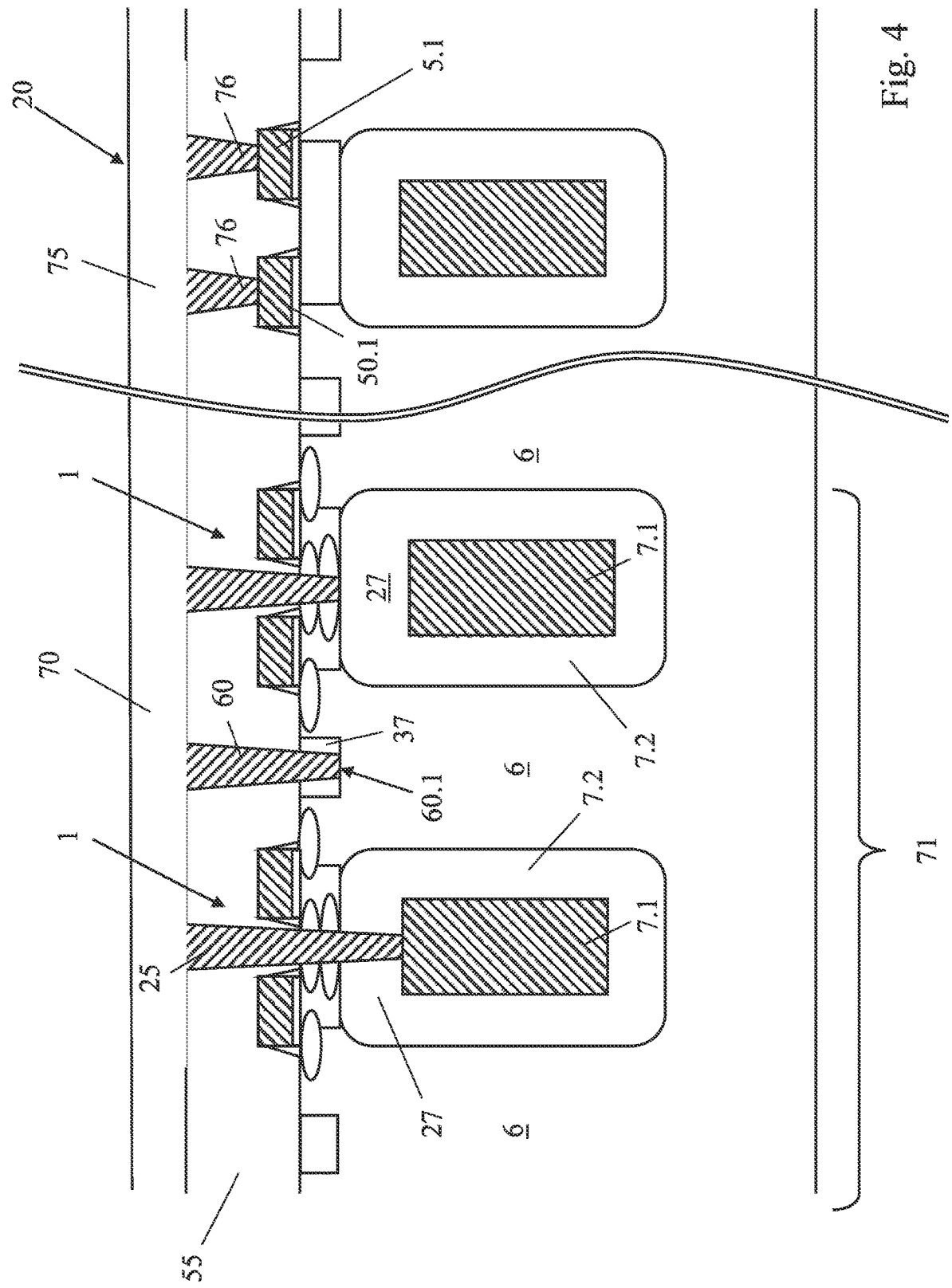

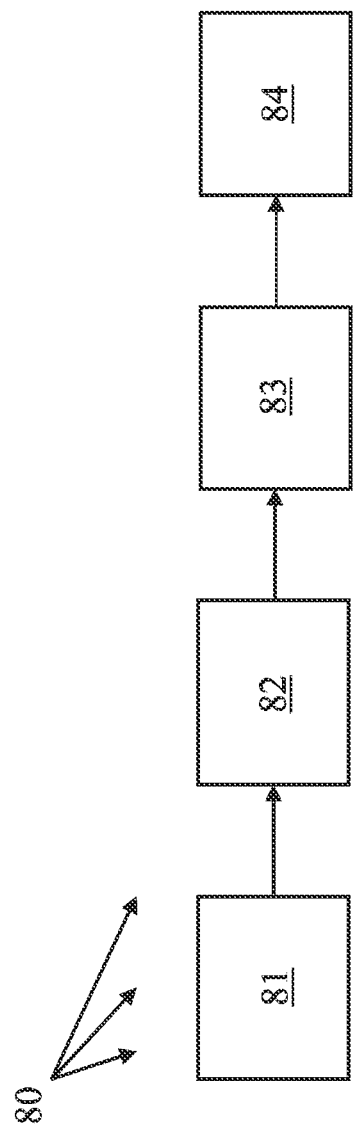

SEMICONDUCTOR DIE WITH A TRANSISTOR DEVICE AND METHOD OF MANUFACTURING THE SAME

TECHNICAL FIELD

The present disclosure relates to a semiconductor die with a transistor device.

BACKGROUND

Power devices are often formed in a vertical design, the gate region arranged in a gate trench laterally aside the channel region. Below the latter, a drift region can be provided, vertically between the body and the drain region. In the drift region, a field electrode region can be formed, allowing for instance for a field shaping.

SUMMARY

It is an object of the present application to provide a semiconductor die with an improved transistor device, as well as a method of manufacturing the same.

The device comprises a field electrode region in a field electrode trench which extends into the drift region. However, in contrast to the vertical design described above, the channel region of the device extends laterally, and at least a portion of the channel region is arranged vertically above the field electrode region.

This can for instance allow for an efficient area use, e.g. reduce the lateral dimensions compared to the vertical design, where the gate and the channel region are arranged laterally aside each other. In the vertical design, the possibilities for a further lateral shrink can be limited, e.g. because the field electrode trench itself requires a certain lateral width to achieve a stable conductivity of the field electrode and a certain breakdown robustness of the field dielectric. With the design disclosed here, this limitation can be circumvented at least to some extent, because the area above the field electrode trench is used to arrange the channel and gate region.

In general words, art approach of this application is to combine a vertical field electrode trench with a lateral gate region and, in consequence, lateral channel region. At least a portion of the lateral gate and channel region are arranged vertically aligned with the field electrode region, seen in a vertical cross section e.g. a portion of at least 30%, 50%, 70% or 90%, in particular the whole channel region can be arranged vertically aligned with the field electrode region. As discussed in detail below, the (first) gate region can in particular be formed above a first side of the field electrode region or trench, and an additional gate region can be thrilled above a second side thereof, the first side lying at a first sidewall and the second side lying at a laterally opposite second sidewall of the field electrode trench. This cart allow for an even more efficient area use.

Apart from the area use, the lateral design can for instance also simplify a channel length reduction, the body doping can be aligned well with the gate region and have for instance a step-shaped profile. In contrast, the body doping of a vertical device can have a peak at the upper end and a declining tail downwards, which is easily depleted with increasing source drain voltage such that only a short portion of the channel remains, which impedes a further length reduction. Moreover, the lateral design can for instance allow for the formation of an additional device in another portion of the die independently of the underlying trench, e.g. to integrate additional functions in the same die.

Particular embodiments and features are presented throughout this disclosure and in particular in the dependent claims. Thereby, the individual features shall be disclosed independently of a specific claim category, the disclosure relates to apparatus and device aspects, but also to method and use aspects. If for instance a device manufactured in a specific way is described, this is also a disclosure of a respective manufacturing process, and vice versa.

As discussed in detail below, the source region can be thrilled at a frontside and the drain region at a backside of the die. Due to the horizontal design, the channel region formed in the body region extends laterally between the source region and the drift region, the drain region being arranged vertically below the latter. The field electrode trench extends vertically into the drift region and comprises the field electrode. The latter is made of a conductive material, e.g. metal or polysilicon or a combination of both, and is electrically isolated from the drift region by a field dielectric, which belongs to the field electrode region. The gate electrode thrilled above is made of a conductive material, e.g. polysilicon or metal or a combination of both, and capacitively couples to the channel region via a gate dielectric belonging to the gate region, e.g. silicon oxide, Laterally, the field electrode region can for instance have a longitudinal extension, a plurality of longitudinal field electrode regions can for example be arranged as parallel stripes. Alternatively, the field electrode region can have a spicular or needle-shaped design, wherein a plurality of needle-shaped field electrode regions can be formed in the die, combinations of needles and stripes being possible as well. A needle-shaped field electrode region can for instance be combined with a circular gate region formed above. In case of a stripe-shaped field electrode region, the gate region can also have a stripe-like extension, e.g. in parallel to the field electrode region.

In the lateral design, the channel and the gate region are aligned vertically, one stacked on the other. In general, the body region could be formed above the gate region with the gate electrode, the latter being for instance recessed into the field electrode trench. In particular however, the gate region is arranged above the channel region. "Vertical" or "vertically" refer to the vertical direction, which lies for instance perpendicular to a surface of the die, e.g. the surface of a substrate or an epitaxial layer formed on the substrate. "On a greater vertical height" means closer to the frontside of the die, and "on a smaller vertical height" means closer to the backside. "Lateral" or "laterally" refers to the lateral directions perpendicular to the vertical direction, in which for instance the die area is taken. The channel region "extends laterally", namely has an at least proportional extension in the lateral direction. Seen in a vertical cross-section, a certain tilt is possible in general, e.g. of not more than 45°, 30° or 15°, in particular it can extend in parallel to the lateral direction.

Independently of the specific cell layout, e.g. stripes or needles, the channel length in the horizontal design can be small compared to the cell pitch defined by the field electrode trenches, which can for instance enable a pitch shrink. This can apply particularly when the source region is arranged vertically above the field electrode region, namely vertically aligned with the latter. In particular, the source region can be arranged vertically above the field electrode, e.g. centrally above the field electrode trench seen in a vertical cross-section.

In an embodiment, a source contact extending vertically into the source region is arranged vertically above the field electrode region, in particular vertically above the field electrode. The contact can for instance be a source and body contact, which contacts the source region and, in addition, vertically below the body region. It can be a metal contact, for example made of tungsten. Seen in a vertical cross-section, the contact can in particular be arranged centrally above the field electrode trench.

Generally, an insulating spacer can be formed in the field electrode trench above the field electrode, covering the latter upwards. It can be made of oxide, for instance silicon oxide. Regarding its vertical position, the insulating spacer can be arranged within a lower semiconductor body. The lower semiconductor body can for instance comprise a semiconductor substrate and a lower epitaxial layer in which the drift region is formed (see in detail below).

The source or source and body contact arranged above the field electrode region can extend to the insulating spacer. Seen in a vertical cross-section, it can end above the insulating spacer, e.g. inside the body region, which can enable a good contact formation at the bottom of the contact. Alternatively, the contact can extend down to the insulating spacer, ending for instance on the latter, namely at an upper end of the insulating spacer. As a further alternative, the contact can extend into the spacer but end above the field electrode. In any of these cases, the field electrode and the contact are, seen in a vertical cross-section, separated from each other by at least a portion of the insulating spacer, namely electrically isolated from each other.

Alternatively, the source or source and body contact can extend down to the field electrode and electrically contact the latter. In other words, it can bias the field electrode to the source potential, e.g. at least in some locations of the die, namely in some transistor cells. In other locations of the cell field, the contact and the field electrode can be separated by the insulating spacer (see above), wherein the frequency of the extended and separated contacts across the cell field can for instance allow for an adaption of the impedance in a switching application (damping for instance an overshoot during fast switching).

Generally, an upper end of the insulating spacer can for instance lie flush with an upper end of the field electrode trench, namely on the same vertical height. In other words, an upper end of the insulating spacer can lie flush with an upper end of the lower semiconductor body, in which the field electrode trench is formed. In an alternative embodiment, the insulating spacer can be recessed into the field electrode trench, the upper end of the spacer arranged at a smaller vertical height than an upper end of the trench. In other words, the upper end of the spacer can be arranged at a smaller vertical height than a frontside of the lower semiconductor body. The recessed spacer can for instance be advantageous in terms of the design or following process steps during manufacturing. With the recessed spacer, the body and/or source region can for instance be displaced downwards, e.g. at least a portion thereof being arranged in the field electrode trench, which can for example simplify a planarization.

In an embodiment, an additional channel and additional gate region are provided, wherein the additional channel region is, like the (first) channel region arranged at least proportionately above the field electrode region. Seen in a vertical cross-section, the first channel region extends towards a first side and the additional channel region extends towards a second side of the field electrode trench, the first and the second side lying laterally opposite to each other. In particular, the first and the additional channel region can be arranged symmetrically, e.g. with respect to a vertical axis extending centrally through the field electrode.

In an embodiment, the field electrode trench extends into the lower semiconductor body, and the body region is formed in an upper epitaxial layer deposited onto the lower semiconductor body. As mentioned, the lower semiconductor body can in particular comprise a substrate, e.g. a silicon substrate, and a lower epitaxial layer deposited onto the substrate. In the lower semiconductor body, the drift region can be formed, in particular in the lower epitaxial layer. The upper epitaxial layer, in which the body region and for instance the source region are formed, can extend above and cover the field electrode trench upwards, e.g. apart from a contact hole in which the source or source and body contact is formed. As regards the process, the field electrode trench can be etched into the lower semiconductor body first, wherein the upper epitaxial layer is deposited thereafter. In consequence, an upper end of the field electrode trench can be arranged below or at maximum on the same vertical height as a lower end of the upper epitaxial layer.

In an embodiment, the upper epitaxial layer is, seen in a vertical cross-section, interrupted by stop islands. These can lie flush in the upper epitaxial layer, an upper end of a respective stop island lying for instance on the same vertical height as an upper end of the upper epitaxial layer. During the manufacturing of the device, the stop islands can for instance serve as a stop for the planarization, e.g. when excess epitaxial material is removed by chemical mechanical polishing (CMP). In case of an insulating spacer recessed into the trench (see above), the stop islands can have a reduced vertical thickness. They can become so thin that they can even be removed after the planarization, such that they were no longer present in the ready-made die (in contrast to the embodiment described at the beginning of this paragraph). The stop islands can for example be made of an insulating material, e.g. silicon nitride or silicon oxide or a stack made of both.

Generally, the gate electrode can be covered by an insulating layer, e.g. upwards and in addition laterally, made for instance of silicon oxide or Borophosphosilicate glass (BPSG). The insulating layer can in particular be provided on the upper epitaxial layer discussed above. On the insulating layer, a frontside metallization can be formed, for instance a source metallization in the active cell field.

In an embodiment, a Schottky contact extends through the insulating layer and contacts the drift region. The Schottky contact forms a Schottky diode adjacent to the drift region, and this Schottky diode can be electrically connected in parallel to the body diode formed between the body region and the drift region. The Schottky contact or diode can for instance decrease the forward voltage in diode conduction mode or control a breakdown/avalanche behavior, e.g. with a positive impact on parameter drifts during application stress conditions. In particular, the Schottky contact can be formed in the region of a stop island discussed above. Seen in a vertical cross-section, the Schottky contact can intersect the stop island, e.g. centrally.

In an embodiment, a sidewall spacer made of an insulating material, e.g. silicon oxide or nitride, is formed at a sidewall of the gate electrode. In consequence, the spacer is arranged laterally between the sidewall of the gate electrode and the upper epitaxial layer. Seen in a vertical cross-section, it can have a profile tapering upwards, e.g. have a larger lateral width at its lower end compared to the upper end. The tapered spacer can for instance be created by a deposition of the insulating material in combination with a subsequent etch back step, e.g. an at least partially anisotropic etch back. The sidewall spacer can for example be advantageous in subsequent process steps, e.g. protect the gate dielectric from a lateral etch attack and/or avoid an implantation at the edge of the gate region.

In an embodiment, a doped region of the same conductivity type as the source region is formed at that end of the channel region, which lies laterally opposite to the source region. In other words, when the body region is of a second conductivity type, the source region and the additional doped region are both of a first conductivity type, the drift region and the drain region being of the first conductivity type as well. In the exemplary embodiments, the first type is n-type, and the second type is p-type. Independently of these details, the additional doped region can for instance allow for tuning a gate drain charge (QGD) and optimizing the channel performance.

The method of manufacturing the semiconductor die can comprise the following steps:
i) etching the field electrode trench;
ii) forming the field electrode region with the field electrode in the field electrode trench;
iii) forming the body region;
iv) forming the gate region next to the body region to define the channel region.

In general, the gate region can be arranged inside the trench, e.g. at least a vertical portion of the gate region being arranged laterally between the trench sidewalls, wherein the body region is formed above (see the description above). In particular, however, the body region is arranged below the gate region, the latter being formed on the body region in step iv).

In an embodiment, steps i) and ii) are performed initially, and the upper epitaxial layer is deposited subsequently. After the deposition, it can cover the trench completely, optionally it can be opened locally to define a contact thereafter, e.g. the source or source and body contact. In the upper epitaxial layer, the body region is formed, wherein the layer can be doped in situ during the deposition and/or in particular in a subsequent step. The subsequent body doping can for instance be defined in a lithography step, for example by a structured lithography layer. With the subsequent doping, e.g. a retrograde body profile is possible.

A subsequent implant step for forming the source and/or body region can in particular be performed after the gate electrode formation, e.g. after depositing and structuring a gate electrode layer. In Particular, the doping can be performed after the sidewall spacer formation discussed above. Steps iii) and iv) can be interwoven when step iii) comprises for instance the deposition of the upper epitaxial layer prior to the gate region formation and a doping afterwards. In an embodiment, the additional doped region laterally opposite to the source region is formed after the gate dielectric and electrode have been formed.

In an embodiment, a dielectric layer is formed on the upper epitaxial layer to obtain the gate dielectric. Onto the dielectric layer, the gate electrode material is deposited subsequently to form the gate electrode. The dielectric layer can be deposited onto or grown on the upper epitaxial layer, e.g. as a thermal oxide. Independently of the specific formation, the dielectric material can in particular be silicon oxide.

BRIEF DESCRIPTION OF THE DRAWINGS

Below, the power device and manufacturing of the same are explained in further detail by means of exemplary embodiments. Therein, the individual features can also be relevant in a different combination.

FIG. 2*a-h* illustrate some process steps for manufacturing the transistor device of FIG. 1;

FIG. 4 illustrates some variants of the transistor device, which can be integrated into the die, and an additional Schottky contact;

FIG. 5 illustrates some manufacturing steps in a flow diagram.

DETAILED DESCRIPTION

Figure 1:
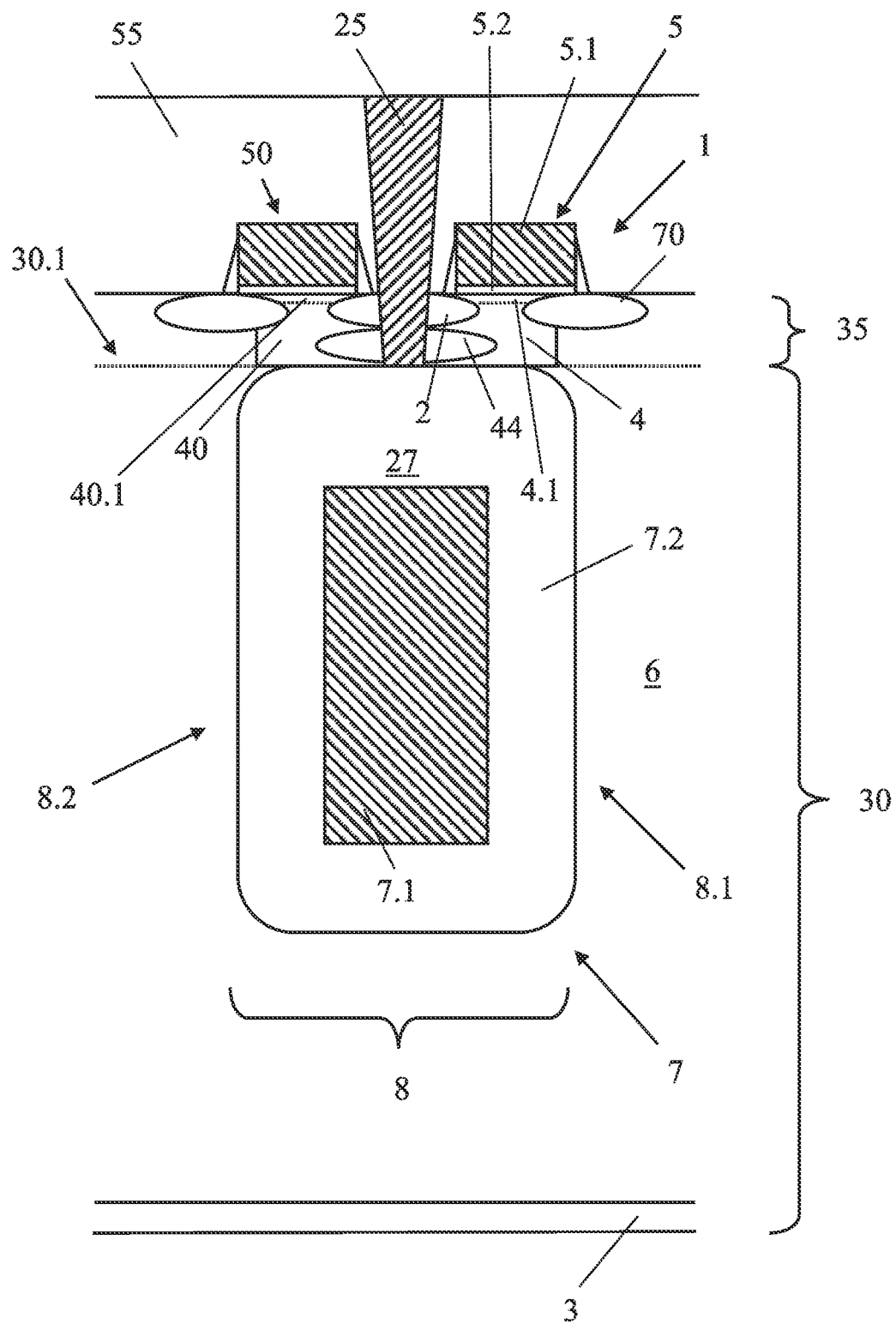
FIG. 1 shows a portion of a semiconductor die with a transistor device in a sectional view.

FIG. 1 illustrates a transistor device 1, which has a source region 2 and a drain region 3, the latter formed at a backside. The source region 2 is arranged at a frontside, together with a body region 4, in which a channel region 4.1 is formed. A gate region 5 with a gate electrode 5.1 and a gate dielectric 5.2 is formed above the body region 4, the gate region 5 and the channel region 4.1 are oriented laterally. Between the body region 4 and the drain region 3, a drift region 6 is formed, wherein a field electrode trench 8 extends into the drift region 6. In the trench 8, a field electrode region 7 is formed, comprising a field electrode 7.1 and a field dielectric 7.2.

The field electrode trench 8 with the field electrode region 7 is formed in a lower semiconductor body 30, which can be made of a substrate, in which the drain region 3 is formed, and an epitaxial layer, in which the drift region 6 is formed. On a frontside 30.1 of the lower semiconductor body 30, an upper epitaxial layer 35 is arranged. The field electrode trench 8 extends solely in the lower semiconductor body 30, it does not reach upwards into the upper epitaxial layer 35. The trench is covered by the upper epitaxial layer 35, and the source region 2 and body region 4, as well as the gate region 5, are formed vertically above the field electrode trench 8. This allows for an efficient area use, as discussed in detail in the general description.

As apparent from the sectional view, the source region 2 is arranged vertically above the field electrode region 7, and a source contact 25 is formed centrally above the field electrode 7.1. It extends through an insulating layer 55, down to the source region 2. In this example, it contacts also the body region 4, namely extends into a highly doped body contact region 44. The latter is, like the body region 4 in the example shown here, p-doped, but with a higher doping concentration. In the example shown here, the source contact 25 ends on an insulating spacer 27 formed in the field electrode trench 8 above the field electrode region 7.

Laterally opposite to the source region 2, a doped region 70 is formed at the end of the channel region 4.1. It is of the same conductivity type as the source region 2, n-type in the example shown here, and can for instance enable a channel performance optimization.

With the source contact 2.5 arranged centrally, the channel region 4.1 and the gate region 5 extend in direction to a first side 8.1 of the field electrode trench 8. On the other side of the source contact 25, an additional body region 40 with an additional channel region 40.1 and an additional gate region 50 above are formed. They extend in direction to a second side 8.2 of the field electrode trench 8, laterally opposite to the first side 8.1. With both channel regions 4.1, 40.1 arranged above the field electrode trench 8, the area above can be used efficiently.

FIG. 2a illustrates a process step, where the field electrode trench 8 has already been etched into the lower epitaxial layer 30a formed on the substrate 30b. In the trench, the field electrode region 7 has been formed, and the trench has been filled up with the insulating spacer 27 above.

In a subsequent step shown in FIG. 2b, stop islands 36 have been formed on the lower epitaxial layer 30a, namely on the frontside 30.1 of the lower semiconductor body 30. For that purpose, a stop layer, e.g. silicon nitride layer, is deposited and structured to arrive at the islands shown in FIG. 2b. Subsequently, the upper epitaxial layer 35 is deposited epitaxially, followed by a planarization, e.g. CMP. This results in the structure shown in FIG. 2c, the stop islands 36 lying flush in the upper epitaxial layer 35.

Figure 2D:
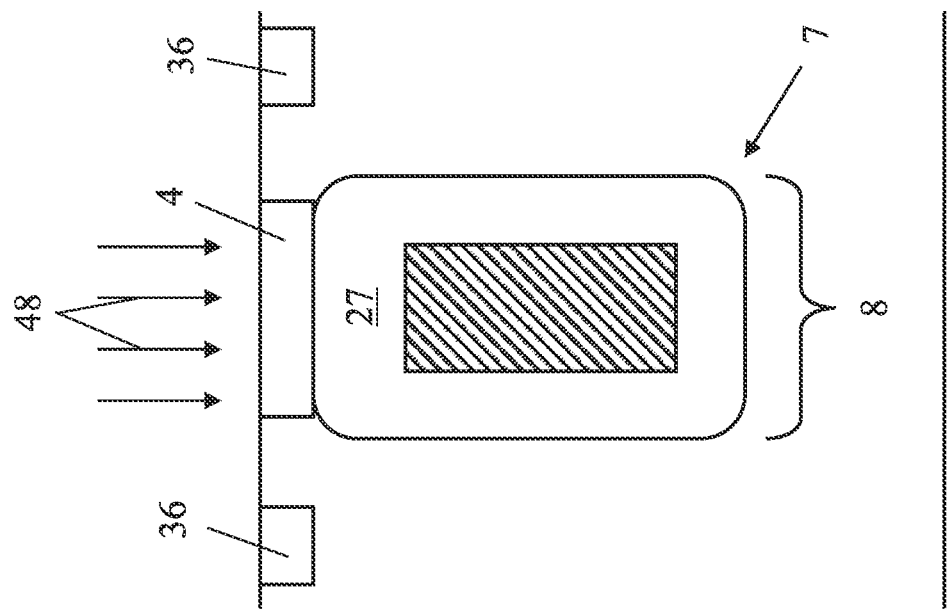
Figure 2C:
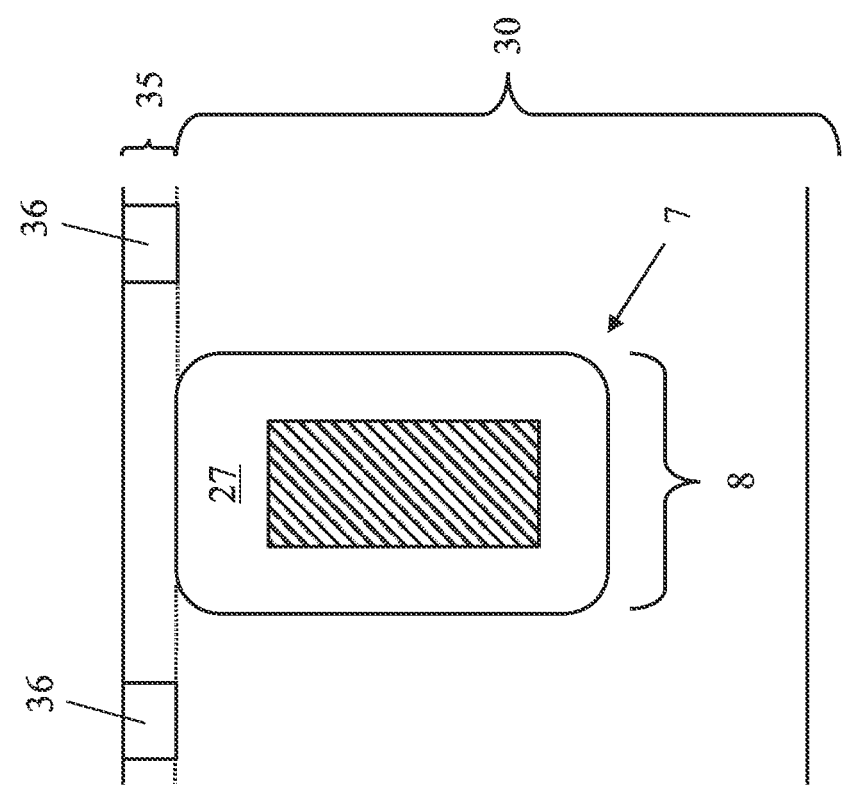
Figure 2F:
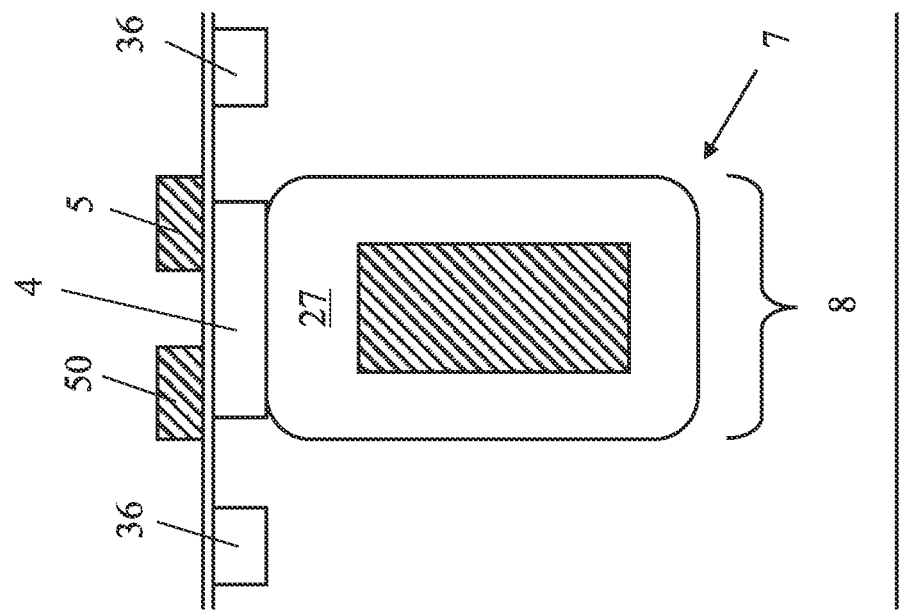
Figure 2E:
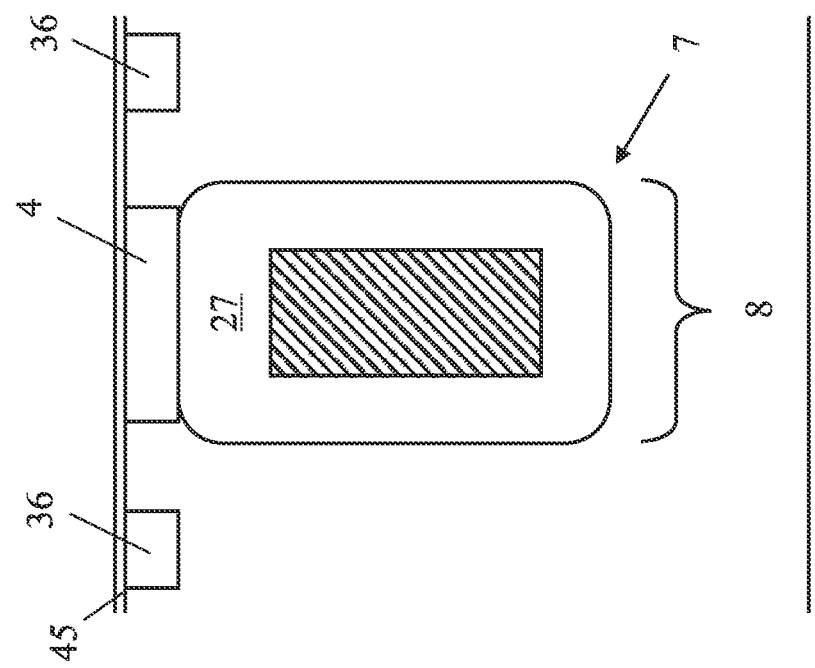

FIGS. 2d and 2e illustrate an implantation 48 to form the body region 4 and the formation of a dielectric layer 45 for the gate dielectric, wherein the sequence of these process steps can also be inverse (layer formation prior to the implantation). Subsequently, the gate electrodes 5, 50 are formed, as shown in FIG. 2f. By a subsequent oxide or nitride deposition, combined with an etch back step, sidewall spacers 65 are thrilled at the gate electrodes 5, 50, as shown in FIG. 2g. They can protect the gate dielectric 5.2, 50.2, when the dielectric layer 45 is etched back, and prevent an implantation at the edges during subsequent implantations, e.g. for the source region.

Figure 2H:
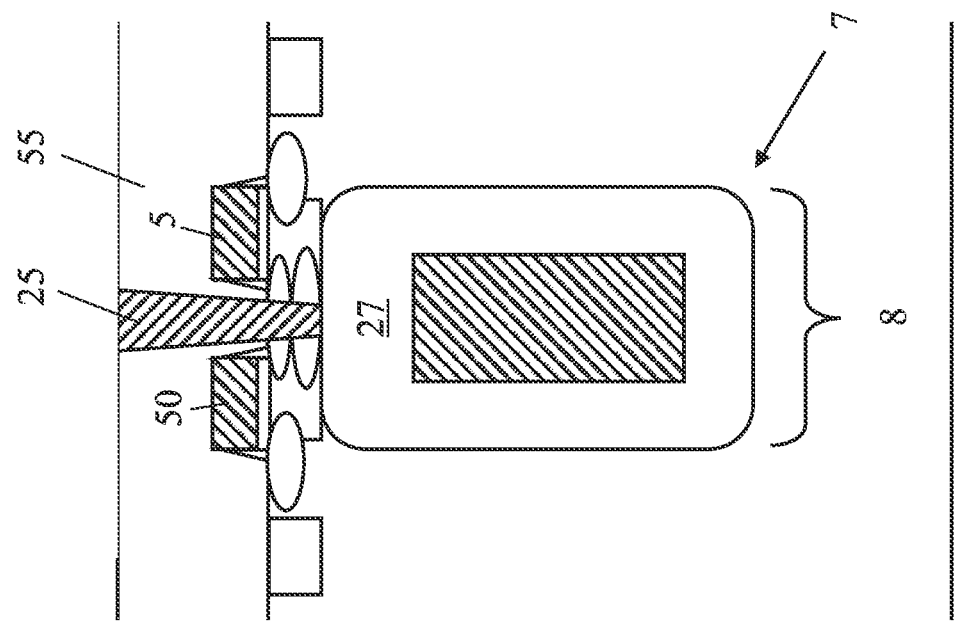
Figure 2G:
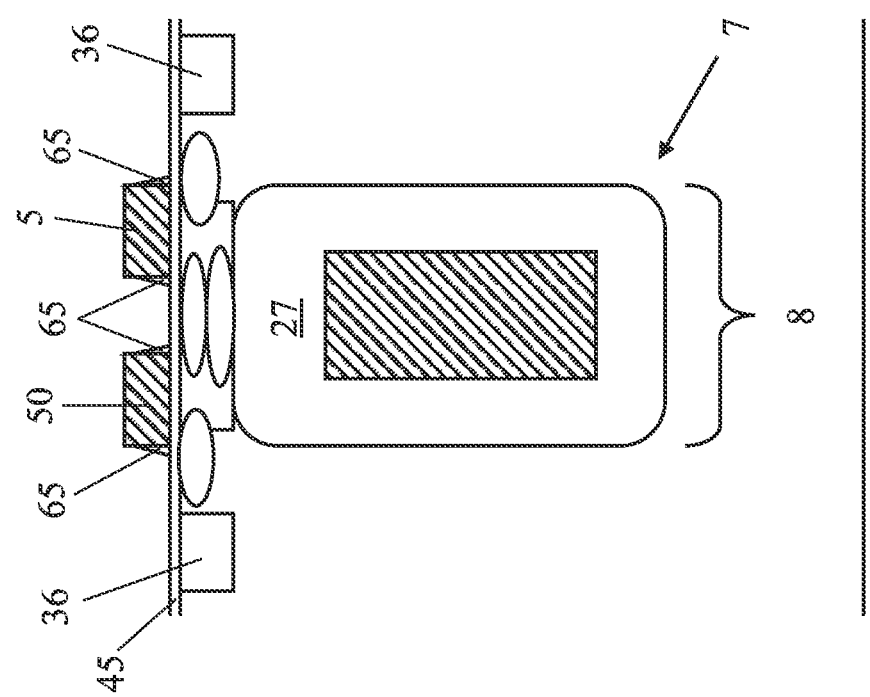

In FIG. 2h, the insulating layer 55 has been deposited to cover the gate electrodes 5, 50, and a contact hole has been etched and filled, e.g. with tungsten, to form the source contact 25.

Figure 3:
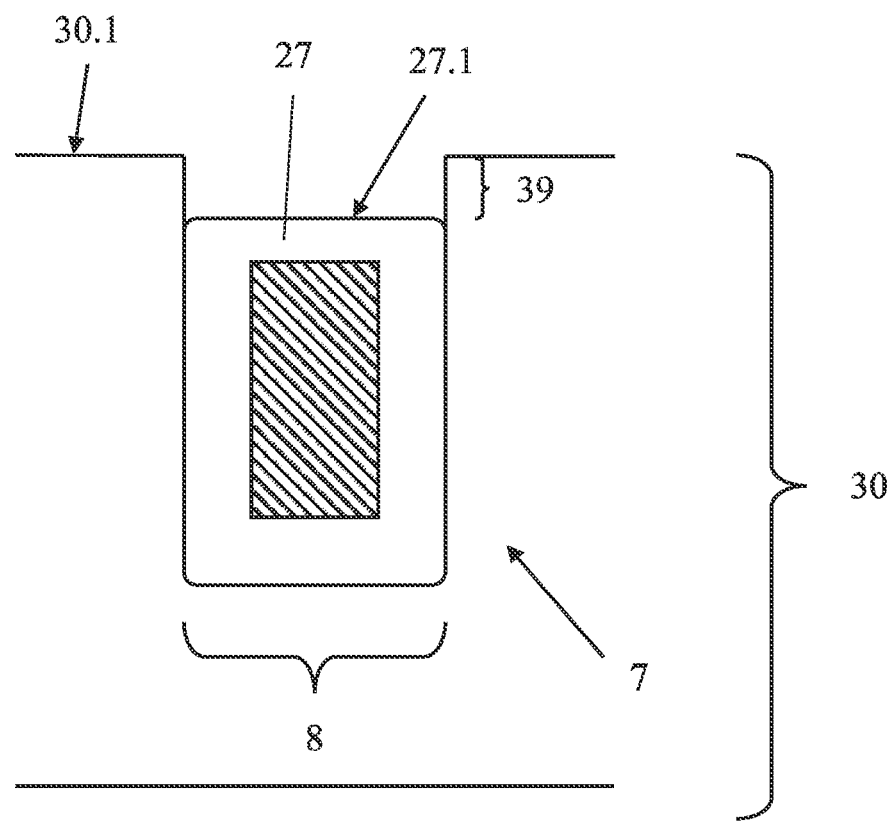
FIG. 3 illustrates a further process step, which can be implemented optionally.

FIG. 3 illustrates a process step that can be implemented optionally between FIGS. 2a and 2b. Here, an upper end 27.1 of the insulating spacer 27 is recessed 39 into the field electrode trench 8, namely arranged on a smaller vertical height than the frontside 30.1 of the lower semiconductor body 30. Likewise, a portion of the body region 4 can be displaced into the field electrode trench 8, see the general description in detail.

FIG. 4 illustrates different transistor devices 1 integrated into the semiconductor die 20. In addition, between the two transistor devices 1, a Schottky contact 60 extends through the insulating layer 55, it forms a Schottky diode 60.1 with the drift region 6. The Schottky diode junction 60.1 can for instance decrease the forward voltage in diode conduction mode, see the general description in detail. The Schottky contact 60 intersects the stop island 37, allowing for an efficient area use.

The transistor device 1 shown on the right hand of the Schottky contact 60 is constructed as explained in detail with reference to FIG. 1. The transistor device 1 on the left hand of the Schottky contact 60 has basically the same set-up, differing only in the extension of the source contact 25. It extends down through the insulating spacer 27 and contacts the field electrode 7.1. Across the die 20, the two types shown can vary, wherein the impendence in a switching application can be adapted by the frequency.

On the insulating layer 55, a frontside metallization 70 is thrilled, e.g. an aluminum metallization, serving as a source metallization. The frontside metallization 70 above the cell field 71 is electrically isolated from a metallization shown on the right and serving as a gate metallization 75. Via gate contacts 76 extending through the insulating layer 55, it is electrically connected to the gate electrodes 5.1, 50.1.

FIG. 5 illustrates some process steps 80 in a flow diagram. After etching 81 the field electrode trench, the field electrode region is formed 82. For forming 83 the body region, the upper epitaxial layer is deposited and doped. By forming 84 the gate region, the channel region is defined.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die with a transistor device, comprising:
    a source region;
    a drain region;
    a body region comprising a channel region;
    a gate region which comprises a gate electrode next to the channel region, for controlling a channel formation;
    a drift region between the channel region and the drain region;
    a field electrode region with a field electrode formed in a field electrode trench which extends into the drift region;
    a source contact which extends vertically into the source region and is arranged vertically above the field electrode; and
    an insulating spacer formed vertically above the field electrode in the field electrode trench,
    wherein an upper end of the insulating spacer is recessed into the field electrode trench,
    wherein the channel region extends laterally and is aligned vertically with the gate region, and
    wherein at least a portion of the channel region is arranged vertically above the field electrode region.

2. The semiconductor die of claim 1, wherein the source region is arranged vertically above the field electrode region.

3. The semiconductor die of claim 1, further comprising an additional channel region and an additional gate region, wherein the additional channel region extends laterally and is aligned vertically with the additional gate region, wherein at least a portion of the additional channel region is arranged vertically above the field electrode region, and wherein in a vertical cross-section, the channel region and the additional channel region extend towards opposite sides of the field electrode trench, respectively.

4. The semiconductor die of claim 1, wherein the field electrode trench extends into a lower semiconductor body, and wherein the body region is formed in an upper epitaxial layer provided on the lower semiconductor body.

5. The semiconductor die of claim 4, wherein the upper epitaxial layer is, in a vertical cross section, interrupted by stop islands lying flush in the upper epitaxial layer.

6. The semiconductor die of claim 5, further comprising an insulating layer covering the gate electrode, wherein a Schottky contact extends through the insulating layer and contacts the drift region.

7. The semiconductor die of claim 6, wherein the Schottky contact extends through one of the stop islands.

8. The semiconductor die of claim 1, wherein the gate electrode is formed on an upper epitaxial layer, and wherein a sidewall spacer of an insulating material is formed between a sidewall of gate electrode and the epitaxial layer.

9. The semiconductor die of claim 1, further comprising a doped region formed at an end of the channel region laterally opposite to the source region, the doped region being of the same conductivity type as the source region.

10. A semiconductor die with a transistor device, comprising:
   a source region;
   a drain region;
   a body region comprising a channel region;
   a gate region which comprises a gate electrode next to the channel region, for controlling a channel formation;
   a drift region between the channel region and the drain region; and
   a field electrode region with a field electrode formed in a field electrode trench which extends into the drift region;
   wherein the channel region extends laterally and is aligned vertically with the gate region,
   wherein at least a portion of the channel region is arranged vertically above the field electrode region,
   wherein the field electrode trench extends into a lower semiconductor body, and
   wherein the body region is formed in an upper epitaxial layer provided on the lower semiconductor body.

11. The semiconductor die of claim 10, wherein the source region is arranged vertically above the field electrode region.

12. The semiconductor die of claim 10, further comprising an insulating spacer formed vertically above the field electrode in the field electrode trench, wherein an upper end of the insulating spacer is recessed into the field electrode trench.

13. The semiconductor die of claim 10, further comprising an additional channel region and an additional gate region, wherein the additional channel region extends laterally and is aligned vertically with the additional gate region, wherein at least a portion of the additional channel region is arranged vertically above the field electrode region, and wherein in a vertical cross-section, the channel region and the additional channel region extend towards opposite sides of the field electrode trench, respectively.

14. A semiconductor die with a transistor device, comprising:
   a source region;
   a drain region;
   a body region comprising a channel region;
   a gate region which comprises a gate electrode next to the channel region, for controlling a channel formation;
   a drift region between the channel region and the drain region;
   a field electrode region with a field electrode formed in a field electrode trench which extends into the drift region; and
   a doped region formed at an end of the channel region laterally opposite to the source region, the doped region being of the same conductivity type as the source region,
   wherein the channel region extends laterally and is aligned vertically with the gate region,
   wherein at least a portion of the channel region is arranged vertically above the field electrode region,
   wherein the field electrode trench extends into a lower semiconductor body, and
   wherein the body region is formed in an upper epitaxial layer provided on the lower semiconductor body.

15. The semiconductor die of claim 14, wherein the source region is arranged vertically above the field electrode region.

16. The semiconductor die of claim 14, wherein the gate electrode is formed on an upper epitaxial layer, and wherein a sidewall spacer of an insulating material is formed between a sidewall of gate electrode and the epitaxial layer.

* * * * *